United States Patent [19]

Ida

[11] Patent Number: 5,896,086
[45] Date of Patent: Apr. 20, 1999

[54] FAILURE DIAGNOSTIC APPARATUS

[75] Inventor: Koki Ida, Sapporo, Japan

[73] Assignee: Matsushita Electric Industrial Co., Ltd., Osaka, Japan

[21] Appl. No.: 08/966,994

[22] Filed: Nov. 10, 1997

[30] Foreign Application Priority Data

Nov. 8, 1996 [JP] Japan ................. 8-296093

[51] Int. Cl.⁶ ............................................. G08B 25/00
[52] U.S. Cl. ................... 340/524; 340/525; 340/500; 340/510; 340/635
[58] Field of Search ............................. 340/524, 525, 340/500, 510, 518, 521, 635

[56] References Cited

U.S. PATENT DOCUMENTS

| | | | |
|---|---|---|---|
| 3,964,302 | 6/1976 | Gordon et al. | 340/525 |
| 4,223,302 | 9/1980 | Hocking | 340/525 |
| 4,274,087 | 6/1981 | Swanson et al. | 340/525 |
| 4,295,129 | 10/1981 | Cade | 340/501 |
| 4,498,075 | 2/1985 | Gaudio | 340/525 |
| 4,506,256 | 3/1985 | Genuit et al. | 340/525 |
| 5,307,050 | 4/1994 | Patton et al. | 340/500 |
| 5,365,438 | 11/1994 | Mitchell et al. | 340/459 |

FOREIGN PATENT DOCUMENTS

| | | |
|---|---|---|
| 2741000A1 | 3/1979 | Germany. |
| 54-143000 | 11/1979 | Japan. |
| 60-189015 | 9/1985 | Japan. |
| 6-165225 | 6/1994 | Japan. |
| 6-290378 | 10/1994 | Japan. |

Primary Examiner—Donnie L. Crosland
Attorney, Agent, or Firm—Ratner & Prestia

[57] ABSTRACT

When one of the failure detecting devices disposed at some spots in an electronic appliance detects failure of the electronic appliance, the failure detecting device detecting the failure generates a certain voltage. From the voltage, a certain specific voltage of good stability is generated as a first information indicating the occurrence of a failure in electronic appliance, and a second information is generated indicating place of failure. A means is provided for generating voltage, or data, which contains the elements of both first and second informations. Based on the voltage, or data, generated from the means, a place of failure is specified and displayed.

7 Claims, 7 Drawing Sheets

FAILURE DIAGNOSTIC APPARATUS

FIELD OF THE INVENTION

The present invention relates to a diagnostic apparatus for distinguishing failures occurred in electronic appliances such as television receivers, display monitors, etc.; more specifically, a failure diagnostic apparatus which reliably indicates places of disorder in an electronic appliance by a simple circuit structure.

BACKGROUND OF THE INVENTION

As shown in FIG. 6, prior art failure diagnostic apparatus comprises a plurality of failure detecting devices 1a–1z, each of which failure detecting devices generates various voltages according to the state of failure detected. Diverse voltage levels generated by the respective failure detecting devices 1a–1z are delivered to input port of a microcomputer 4, each of the voltages at a different time. From the level of voltage and the time of input a signal is discernible as to which failure detecting device it is from, and from the voltage content of the failure is judged; the results of judgment is displayed on a Light Emitting Diode 5, or a sole display device, indicating the content of failure with the number of blinking.

In prior art failure diagnostic apparatus, however, the accurate designation of the place of failure was difficult because the output of failure detecting device is inputted direct to microcomputer 4 and the voltage level and the time fluctuate depending on the state of failure.

In the prior art apparatus shown in FIG. 7, disclosed in the Japanese Patent Laid-Open Application No.6-290378, at first a control unit 11 issues series signals ordering slave devices 12, 13, 14 and 15 to detect failure; responding to the series signals the slave devices 12, 13, 14 and 15 output their respective failure data. A failure place specifying unit 19 receives the failure data and conducts diagnosis; judging the place of failure from the timing at which one of the series signals the failure data was outputted, and the content of failure from the level of voltage.

Among the problems prior art procedures have is the difficulty in accurately locating a place of failure; because in the prior art procedures the voltages from failure detecting devices are delivered direct to the input port of a microcomputer, furthermore, the failure diagnosis is dependent on dual factors, viz. the voltage level and the time, and the voltage level and the time fluctuate depending on the state of failure.

According to what is disclosed in the Japanese Patent Publication No. 6-290378 the content of failure and the place of failure are diagnosed based on failure data generated in response to an order in the form of series signals issued from outside; which means that the failure diagnosis is not available without receiving an order in the form of series signals from the outside.

SUMMARY OF THE INVENTION

In a failure diagnostic circuit according to the present invention, when one of the failure detecting devices disposed in certain points of an electronic appliance detects a failure sign, the failure detecting device which detected the failure sign generates a certain voltage. From the voltage, a certain specific voltage of good stability is generated as a first information indicating the occurrence of failure in the electronic appliance, and a second information is generated indicating a place of the failure. And a system is provided for generating a voltage, or data, which contains the elements of both the first and the second informations. Based on the voltage, or data, generated, a place of failure is located and displayed. An invented failure diagnostic apparatus for electronic appliances is implementable based on the failure diagnostic circuit.

Namely, the failure diagnostic apparatus for electronic appliances comprises a failure detecting means for detecting a place of failure, a certain specific voltage generating means for outputting, as a first information, the failure detected by the failure detecting means after converting it into certain specific voltage, a failure data generating means for outputting, as first and second informations, respective outputs from the certain specific voltage generating means after converting them into voltage, or data, corresponding to the place of failure, a failure place specifying means for specifying a place of failure based on the voltage, or data, outputted from the failure data generating means, and a failure place display means for displaying the place of failure in accordance with the output delivered from the failure place specifying means.

Described practically, a failure data delivered from each respective failure detecting device is supplied to input port of a TTL-IC, and output port of the TTL-IC delivers a certain specific voltage as a first information, and a second information which is obtained from the location of an output port from which the certain specific voltage was delivered; and then certain voltage containing the elements of both the first and the second informations is outputted through a voltage converting device connected with the output port. In this way, the certain specific voltage generating means and the failure data generating means maybe formed. As an alternative, an IIC-IC may be employed; in this case, failure data delivered from each of the failure detecting devices is supplied to input port of the IIC-IC and certain voltage containing the elements of both the first and the second informations is obtained from output port of the IIC-IC.

As described in the above, a place of failure may be located with ease and a failure diagnosis of high accuracy may be conducted without having an order in the form of series signals, by supplying the voltages generated by a plurality of failure detecting devices severally to the input port of a microcomputer after converting these voltages into certain voltage, or data, of good stability.

DESCRIPTION OF THE PREFERRED EMBODIMENTS (Embodiments)

Failure diagnostic apparatus in accordance with some of the exemplary embodiments of the present invention are described in the following with reference to drawings.

Embodiment 1

Figure 1:
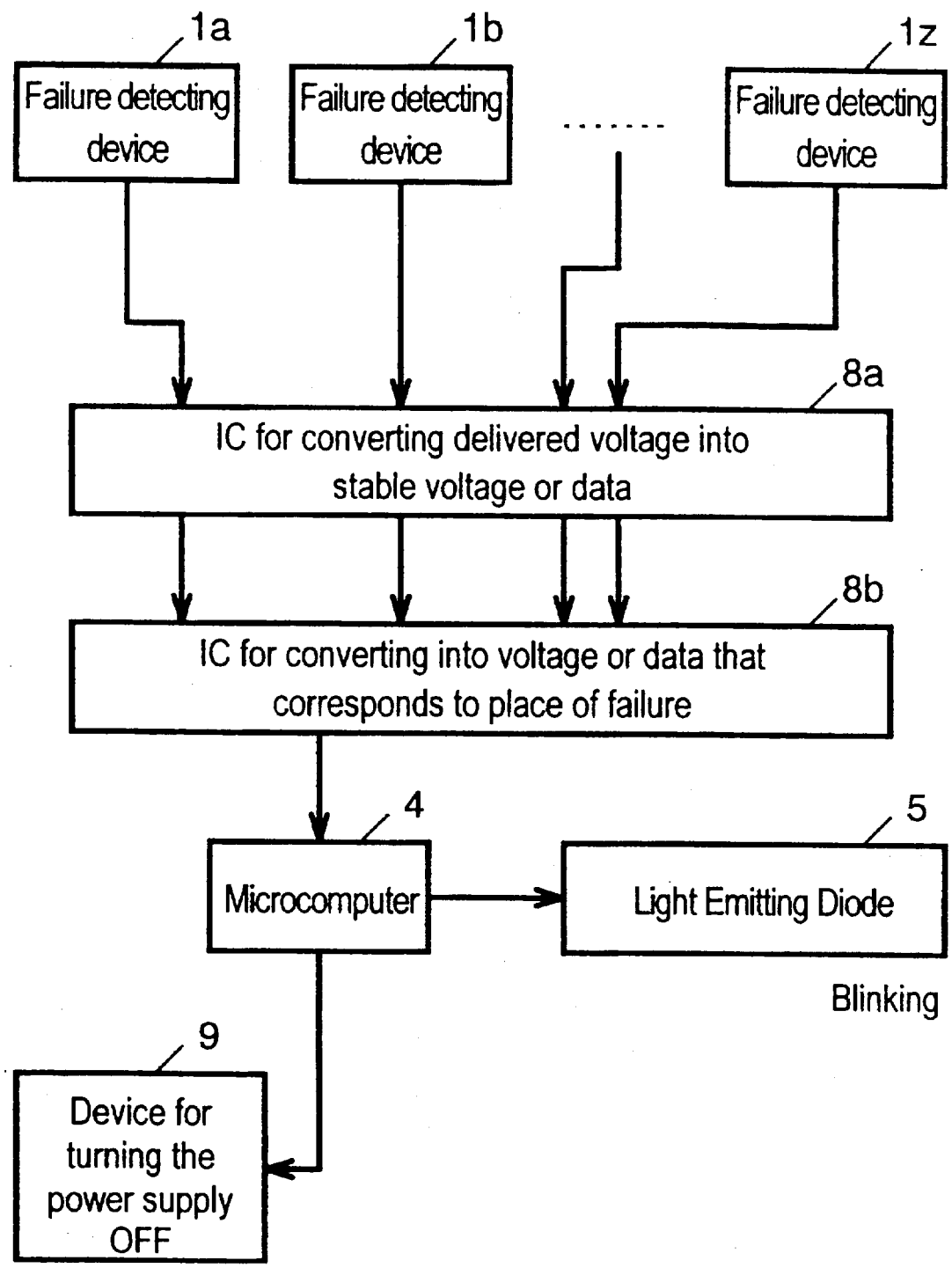
FIG. 1 Block diagram of a failure diagnostic apparatus in accordance with an exemplary embodiment of the present invention.

FIG. 1 shows a basic structure of the present invention as recited in claim 1. A plurality of failure detecting devices 1a–1z which work as a failure detector are disposed at key spots in an electronic appliance, and which failure detecting devices generate a failure signal when the respective spots went into disorder.

Upon receiving the outputs from the failure detecting devices 1a–1z, an electronic circuit (hereinafter referred to as IC) 8a converts the failure detecting outputs delivered from the failure detecting devices 1a–1z severally into certain specific voltage, thus working as a certain specific voltage generating means.

In other words, the IC 8a converts all of the signals from the failure detecting devices into certain specific voltage of good stability, maintaining the information as to which one of the failure detecting devices is the respective signal came from in the form of a position information of the input port through which respective signal was delivered. IC 8a delivers its output severally by each of the respective failure detecting devices 1a–1z through respective output ports; therefore, any output can be identified as to which one of the failure detecting devices it is from.

The output is inputted to an electronic circuit (hereinafter referred to as IC) 8b to be converted into voltage value, or data, corresponding to a place of failure. Thus the IC works as a means for generating failure data.

The output of IC 8b is delivered to a microcomputer 4 which works as a failure place specifying means in which a place of failure is specified on the basis of different voltages, or data, comming from respective failure detecting devices 1a–1z, and a Light Emitting Diode 5 indicates the place of failure by the number of blinking.

Embodiment 2

Figure 2:
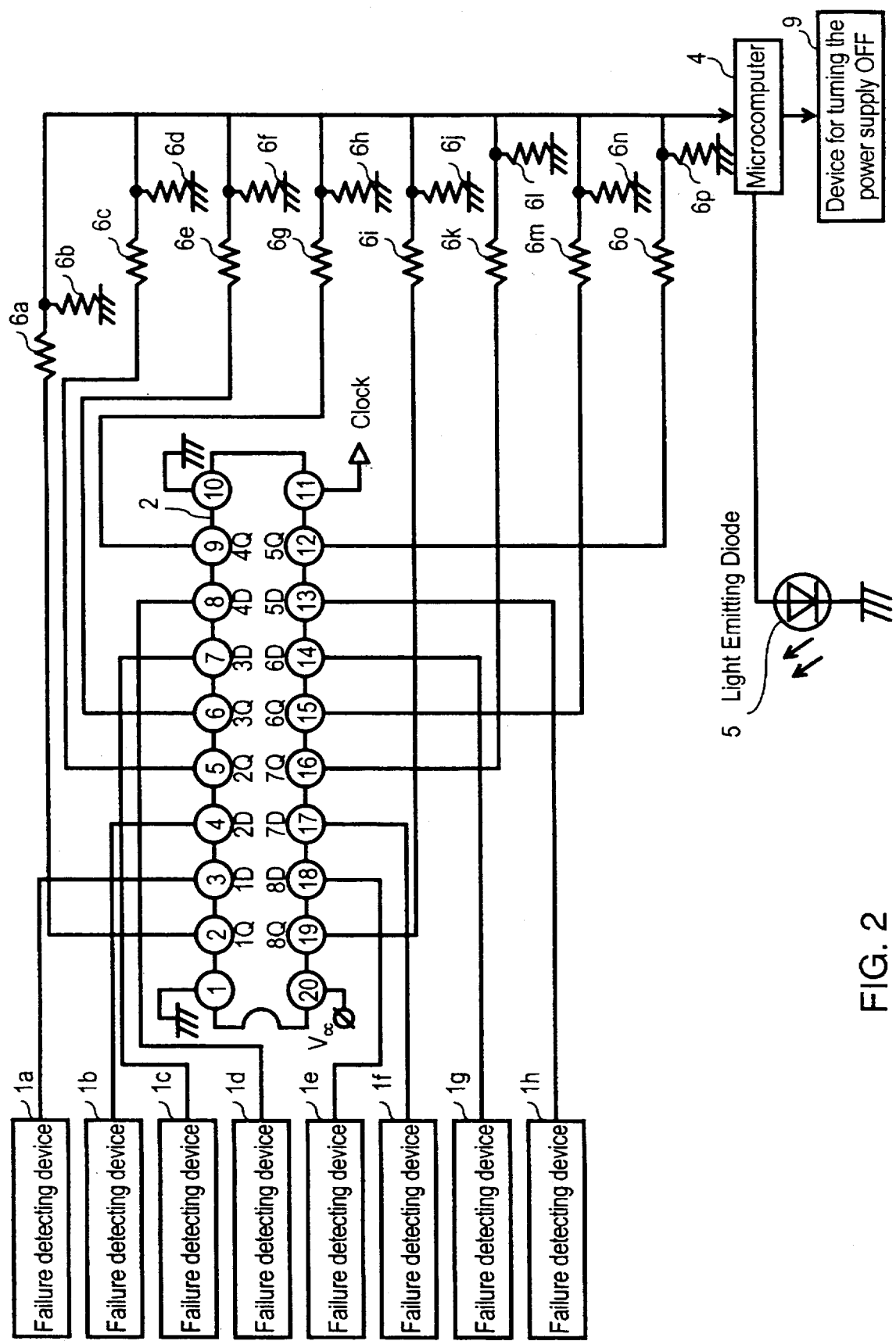
FIG. 2 Block diagram of a failure diagnostic apparatus in accordance with an exemplary embodiment of the present invention.

FIG. 2 is a block diagram showing a failure diagnostic apparatus in accordance with an exemplary embodiment of the present invention. In FIG. 2, voltages from a plurality of failure detecting devices 1a–1h are inputted to TTL-IC 2, or a flip-flop IC.

In the flip-flop IC 2, voltages from a plurality of failure detecting devices 1a–1h are converted into certain specific voltage having a good stability. The output voltage assumes a stepping shape after being divided by a plurality of resistors 6a–6p (namely, as each of the plurality of resistors 6a–6p has its own specific resistance value so as different voltage values are created corresponding to respective failure detecting devices 1a–1h, the voltage of plurality of failure detecting devices 1a–1h to be inputted time sequentially to microcomputer 4 changes to form a stepping shape), which voltage is delivered to a microcomputer 4.

Microcomputer 4 judges state of failure based on the voltage delivered to; and turns the power supply off and notifies the place of failure by blinking the Light Emitting Diode 5, or a sole display device, for plural times according to the voltage. As the blinking counts differ by each of the respective failure detecting devices 1a–1h, one can easily see on which one of the failure detecting devices the display is based. Therefore, whether the failure on display is in a critical place or in a minor spot can surely be discerned.

Embodiment 3

Figure 3:
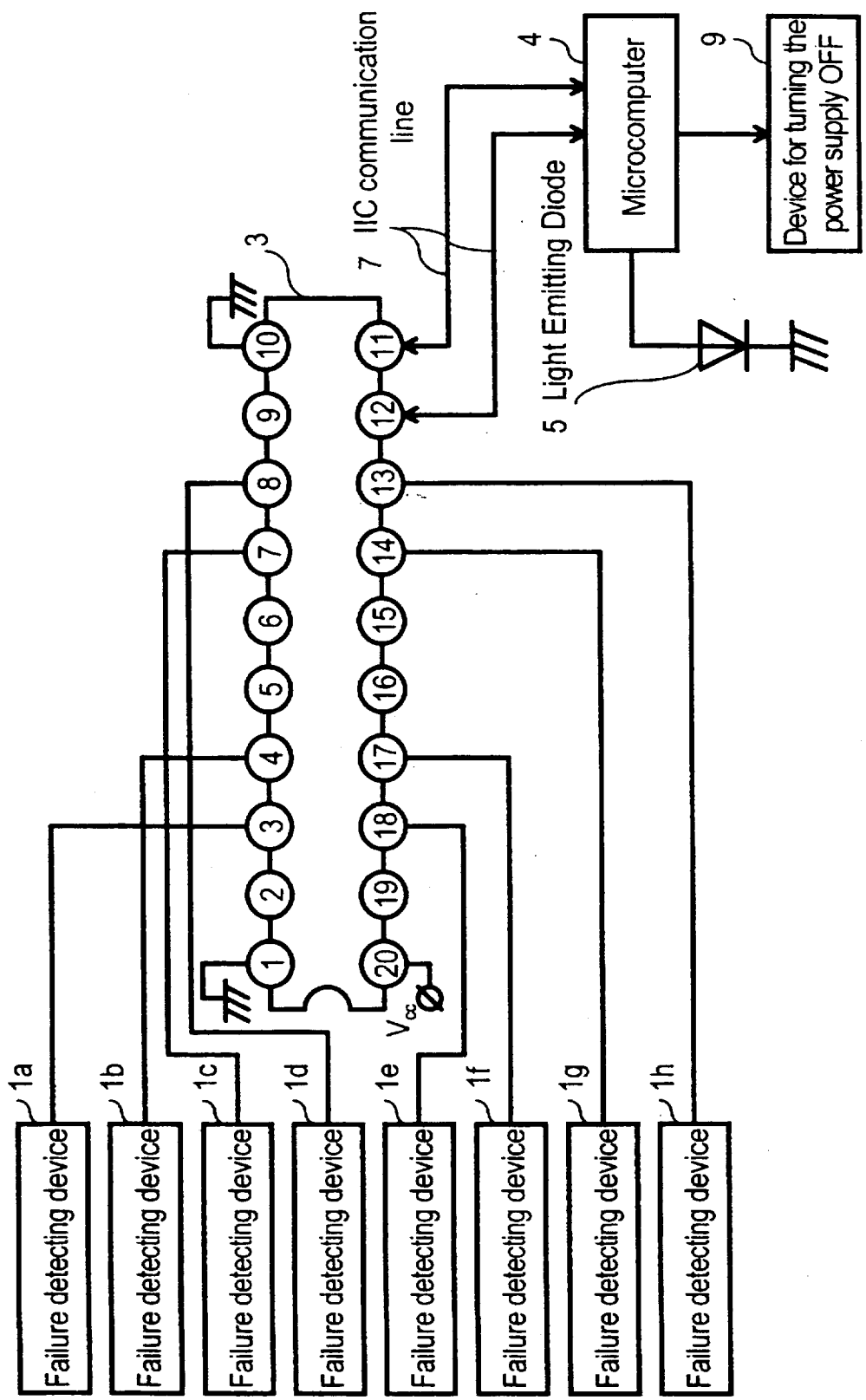
FIG. 3 Block diagram of a failure diagnostic apparatus in accordance with an exemplary embodiment of the present invention.

FIG. 3 is a block diagram showing a failure diagnostic apparatus in accordance with an exemplary embodiment of the present invention. In FIG. 3, the voltage from a plurality of failure detecting devices 1a–1h are delivered to an IC 3 having IIC communication port.

IIC-IC 3 can identify an input as to which failure detecting device it is comming from, by seeing an input port through which the voltage is delivered to. Therefore, an information as to which failure detecting device the voltage is comming from (through which input port the inputting was made) is delivered as different voltage values, or data, to a microcomputer 4 via an IIC communication line 7.

According to the data thus inputted, the microcomputer 4 turns the power supply off by means of a power OFF circuit 9, and at the same time, indicates the place of failure by blinking a Light Emitting Diode 5, or a sole display device, for plural times.

As described in the above, the place of failure may be located with a high reliability, which makes it possible to take a first aid action against the failure.

Embodiment 4

Figure 4:
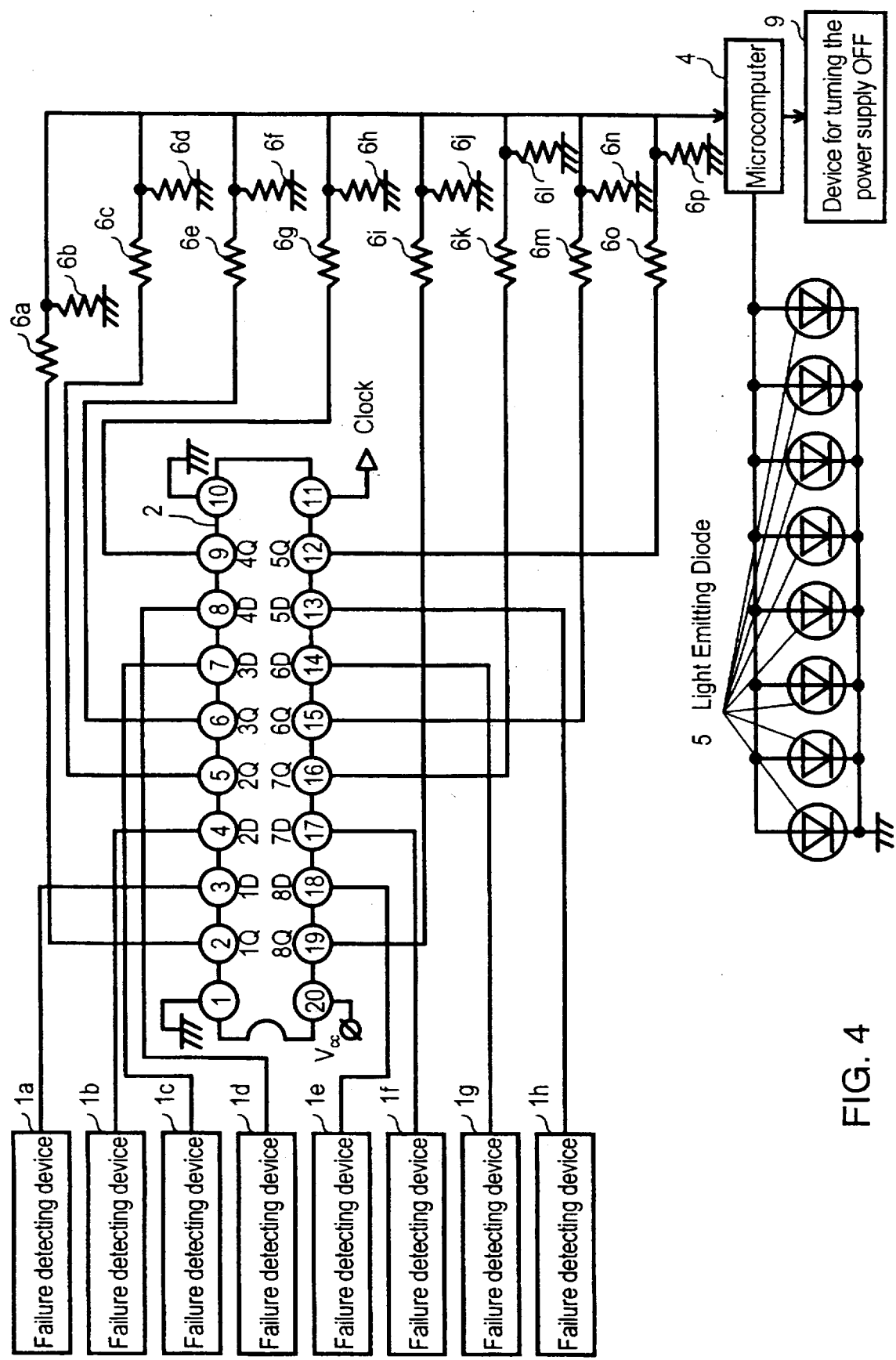
FIG. 4 Block diagram of a failure diagnostic apparatus in accordance with an exemplary embodiment of the present invention.

FIG. 4 is a block diagram showing a failure diagnostic apparatus in accordance with an exemplary embodiment of the present invention. In FIG. 4, the voltage from a plurality of failure detecting devices 1a–1h are delivered to TTL-IC 2, or a flip-flop IC, to be outputted as certain specific voltage of good stability.

The output voltage of flip-flop IC assumes a stepping shape, after being divided by resistors 6a–6p in the same way as in Embodiment 2, the voltage of stepping shape is delivered to a microcomputer 4.

Microcomputer 4 judges the state of failure based on the voltage delivered to; and turns the power supply off and indicates the place of failure by blinking one (some) of Light Emitting Diodes 5, or a plurality of display devices, in a predetermined mode according to the delivered voltage.

Embodiment 5

Figure 5:
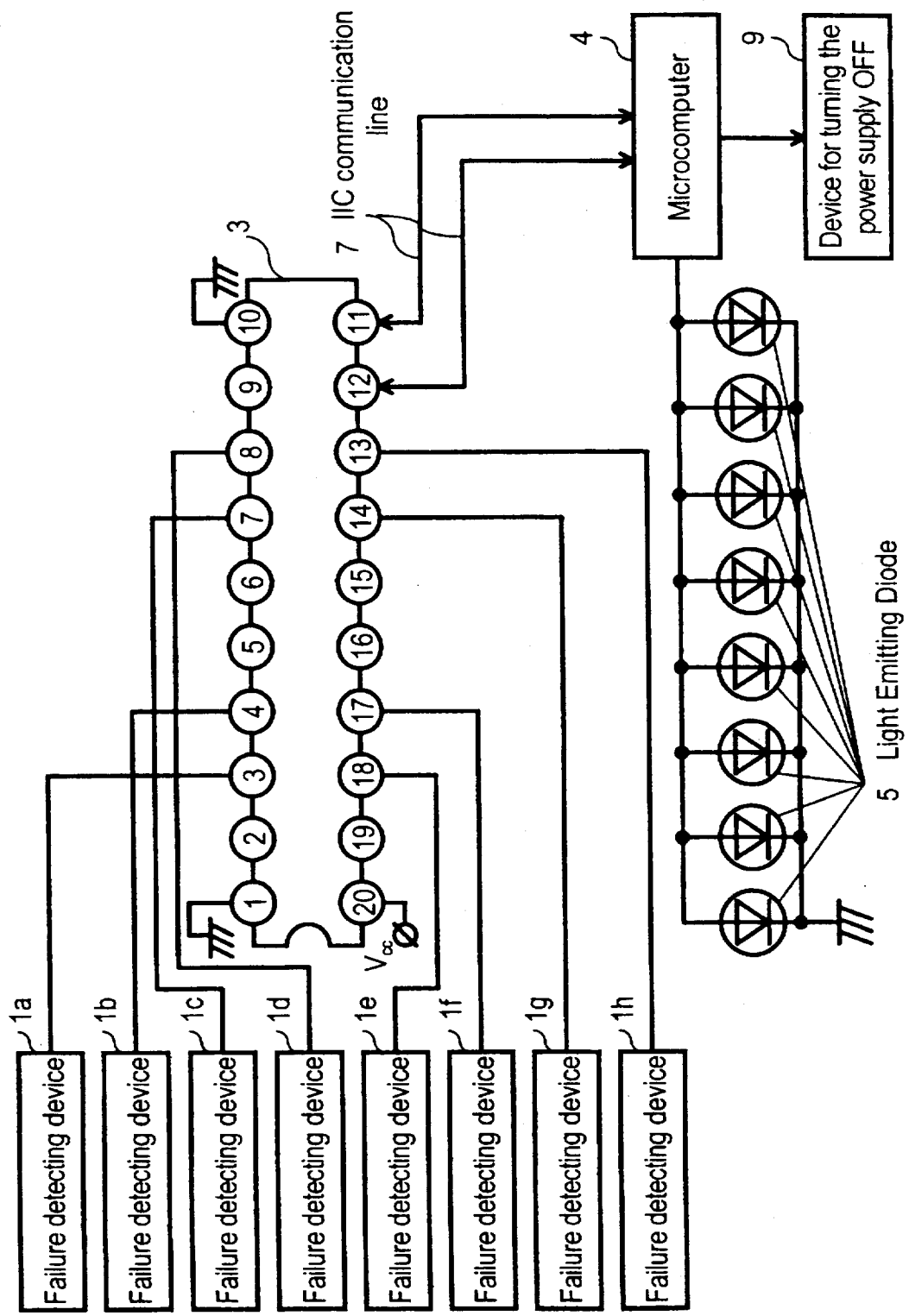
FIG. 5 Block diagram of a failure diagnostic apparatus in accordance with an exemplary embodiment of the present invention.
Figure 6:
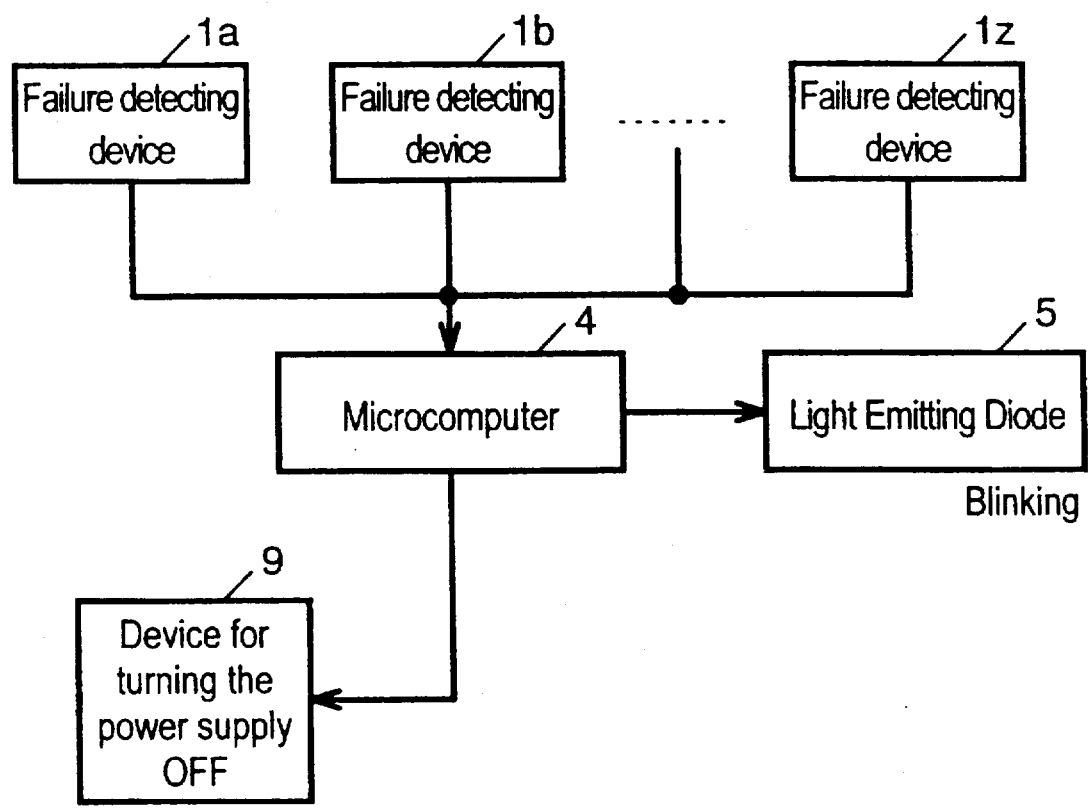
FIG. 6 Block diagram of a prior art failure diagnostic apparatus.
Figure 7:
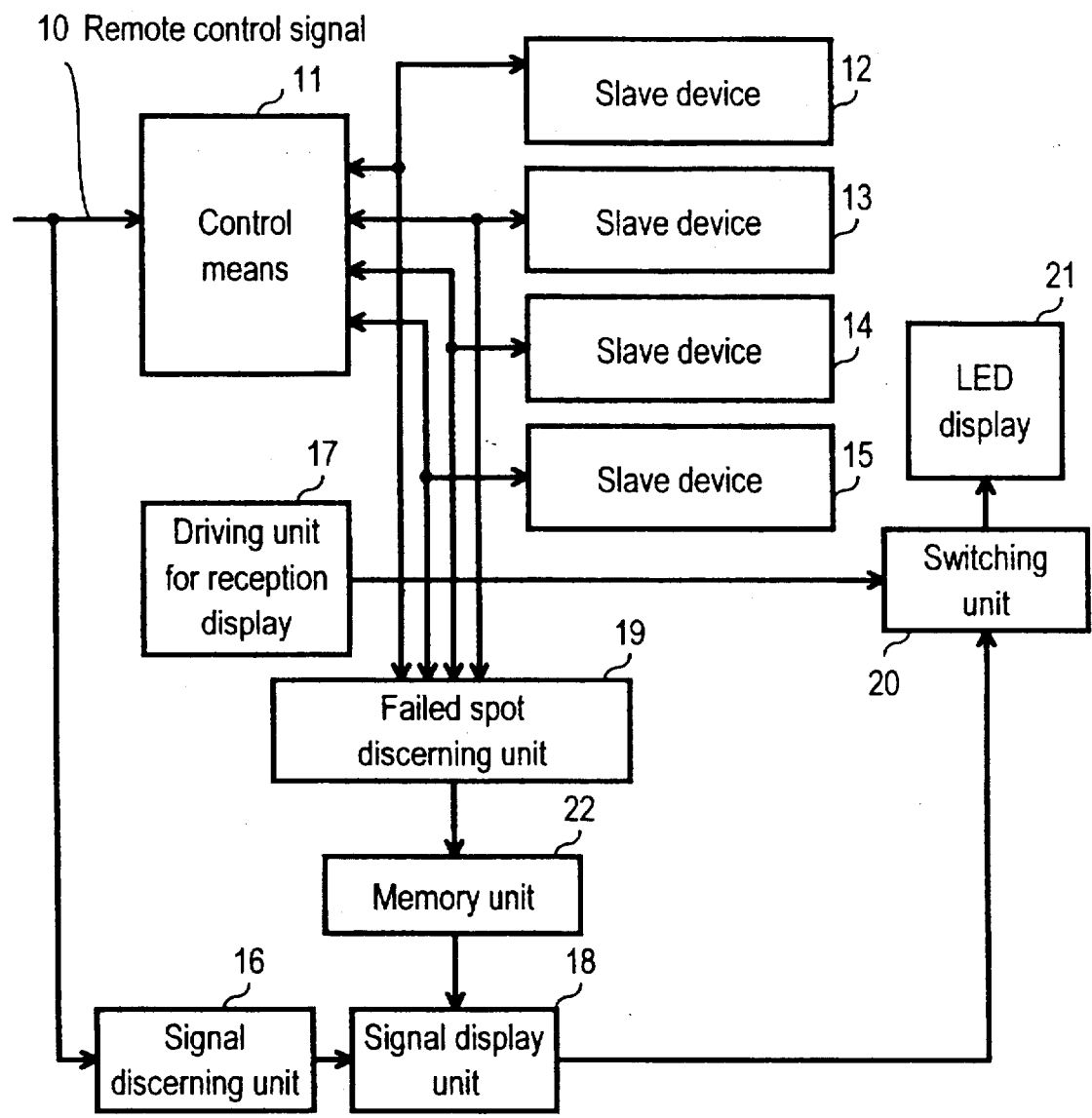
FIG. 7 Block diagram of other prior art failure diagnostic apparatus (Explanation of the Notations)
1a–1z Failure detecting device
2 TTL-IC
3 IIC-IC
4 Microcomputer
5 Light Emitting Diode
6 Resistor
7 IIC communication line
8a IC for converting delivered voltage into stable voltage or data
8b IC for converting into voltage or data that corresponds to place of failure
9 Device for turning the power supply OFF
10 Remote control signal
11 Control means
12, 13, 14, 15 Slave device
16 Signal discerning unit
17 Driving unit for reception display
18 Signal display unit
19 Failed spot discerning unit
20 Switching unit
21 LED display
22 Memory unit

FIG. 5 is a block diagram showing a failure diagnostic apparatus in accordance with an exemplary embodiment of the present invention. In FIG. 5, the voltage from a plurality of failure detecting devices 1a–1h are delivered, likewise in Embodiment 3, to an IC 3 having IIC communication port.

IIC-IC 3 can identify an input as to which one of the failure detecting devices it is comming from, by seeing an input port through which the voltage is comming from. Therefore, an information as to which failure detecting device the voltage is comming from (through which input port the inputting was made) is delivered in the form of different voltage values, or data, to a microcomputer 4 via an IIC communication line 7. According to the voltage or data thus delivered to, the microcomputer 4 turns power supply off by means of a power OFF circuit 9, at the same time indicates, likewise in Embodiment 4, the place of failure by blinking one (some) of Light Emitting Diodes 5, or a plurality of display devices, according to the voltage.

As described in the above, the invented apparatus is able to specify the place of failure at a higher reliability with a simple circuitry, making it possible to conduct a highly precise automatic failure diagnosis without awaiting any order signal from outside, such as series signals for checking operation.

What is claimed is:

1. A failure diagnostic apparatus for an electronic appliance, comprising:

failure detection means for detecting a failure location, specific voltage generating means for converting a failure detected by said failure detection means into a certain specific voltage, failure data generating means for supplying respective outputs from said specific voltage generating means after converting said failure into the certain specific voltage corresponding to said failure location, failure place specifying means for specifying the failure location on the basis of said voltage output from said failure data generating means, and failure place display means for displaying the failure location.

2. A failure diagnostic apparatus for an electronic appliance, comprising:

a plurality of failure detection means for detecting a failure location, specific voltage generating means having i) input ports for inputting respective outputs from said plurality of failure detection means and ii) respective output ports for outputting a certain specific voltage corresponding to each of said input ports, failure data generating means for supplying the output from said specific voltage generating means after converting said failure into the certain specific voltage corresponding to said failure location, failure place specifying means for specifying the failure location the basis of said further voltage from said failure data generating means, and failure place display means for displaying the failure location.

3. The failure diagnostic apparatus for electronic appliance recited in claim 2, wherein the failure data generating means is comprised of a voltage conversion unit consisted of dividing resistors for generating voltages corresponding to respective places of failure.

4. The failure diagnostic apparatus for electronic appliance recited in either claim 1 or 2, wherein the specific voltage generating means is comprised of a TTL-IC.

5. The failure diagnostic apparatus for electronic appliance recited in either claim 1 or 2, wherein the failure place display means is comprised of Light Emitting Diode which indicates place of failure by the number of blinking counts that correspond to the place of failure.

6. The failure diagnostic apparatus for electronic appliance recited in either claim 1 or 2, wherein the specific voltage generating means and the failure data generating means are formed by an IIC-IC.

7. The failure diagnostic apparatus for electronic appliance recited in either claim 1 or 2, wherein the failure place display means is comprised of a plurality of Light Emitting Diodes, each of said plurality of Light Emitting Diodes corresponding to respective places of failure being able to emit light for indicating the place of failure.

* * * * *